United States Patent [19]

Berg, deceased et al.

[11] 3,865,455

[45] Feb. 11, 1975

[54] CIRCUIT BOARD SOCKET

[75] Inventors: Quentin Berg, deceased, late of Cumberland County, Pa. by Frances H. Berg, executrix; , New Cumberland, Pa.

[73] Assignee: E. I. Dupont de Nemours & Co., Wilmington, Del.

[22] Filed: Dec. 6, 1973

[21] Appl. No.: 422,436

[52] U.S. Cl. ............ 339/17 C, 174/68.5, 339/95 D, 339/256 R, 339/275 B

[51] Int. Cl. ....... H01r 9/12, H01r 11/00, H05k 1/02

[58] Field of Search .............. 339/17, 18, 19, 275 R, 339/275 B, 275 T, 276, 278, 256, 258, 255, 260, 262, 95; 174/68.5

[56] References Cited

UNITED STATES PATENTS 3,681,738 8/1972 Friend .............................. 339/17 R

*Primary Examiner*—Roy D. Frazier
*Assistant Examiner*—Terrell P. Lewis
*Attorney, Agent, or Firm*—Thomas Hooker

[57] ABSTRACT

A tubular circuit board socket having an open end to receive a lead with a non-solder adherent collar surrounding the open end to prevent molten solder from flowing through the open end into the interior of the socket during wave soldering.

8 Claims, 4 Drawing Figures

CIRCUIT BOARD SOCKET

The invention relates to circuit board contact sockets of the type mounted in circuit board holes and soldered in the holes, conventionally by a wave-soldering process. The socket includes a generally tubular body with a contact member within the body for forming an electrical connection with a lead inserted through an open end of the body. The lead-receiving open end is located on the side of the circuit board away from the solder wave. A non-solder adherent collar, which may be made of a high temperature plastic material, surrounds the lead-receiving end of the body and prevents molten solder from forming a heavy fillet extending from the printed circuitry on the board to the edge or lip of the open end. In conventional sockets not provided with the non-solder adherent collar, solder from the heavy fillet may flow over the lip of the lead-receiving opening and into the interior of the body thus destroying the usefulness of the socket. This condition is called solder flooding.

The non-solder adherent collar prevents the molten solder from the wave from being flowed up past the collar, thereby eliminating the heavy solder fillet and the objectionable solder flooding. The non-solder adherent collar may be used to surround the lead-receiving opening in a circuit board socket of the type disclosed in Friend U.S. Pat. No. 3,368,738. The collar may be used with other types of sockets also. 3,681,738.

Other objects and features of the invention will become apparent as the description proceeds, especially when taken in conjunction with the accompanying drawings illustrating the invention, of which there is one sheet.

Figure 1:
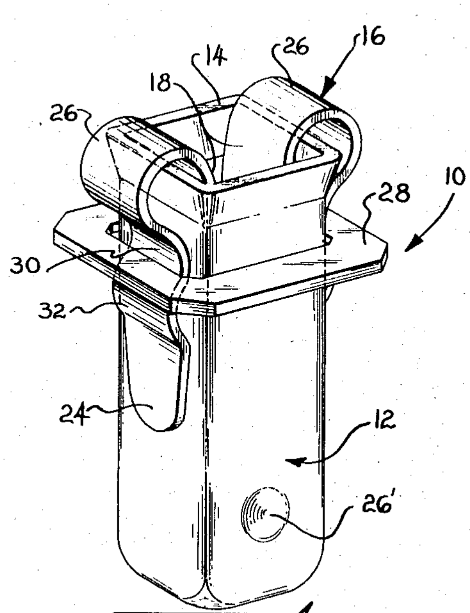
FIG. 1 is a perspective view of a circuit board socket according to the invention.

Circuit board socket 10 includes an elongate tubular body 12 with a flared open end 14. The socket includes a spring contact member 16 having a pair of elongate lead contact arms 18 extending along the length of the interior of the body 12 joined at closed body end 20 by bight portion 22. The other ends of arms 18 join exterior contact arms 24 through spring curls 26. The curls 26 extend around the lip of flared open end 14. Inwardly directed dimples 26' formed in the sides of body 12 extend into the bight portion 22 and retain the spring contact member within the body. A lead may be inserted through end 14 and between arms 18 to form an electrical connection with the socket. Body 12 and spring contact member 16 are essentially as illustrated in U.S. Pat. No. 3,681,738.

Figure 2:
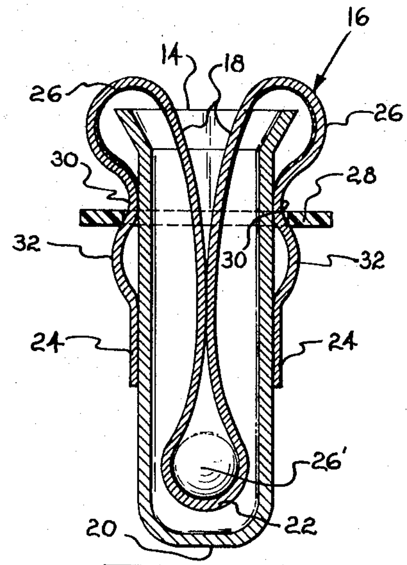
FIG. 2 is a sectional view illustrating the socket of FIG. 1.
Figure 3:
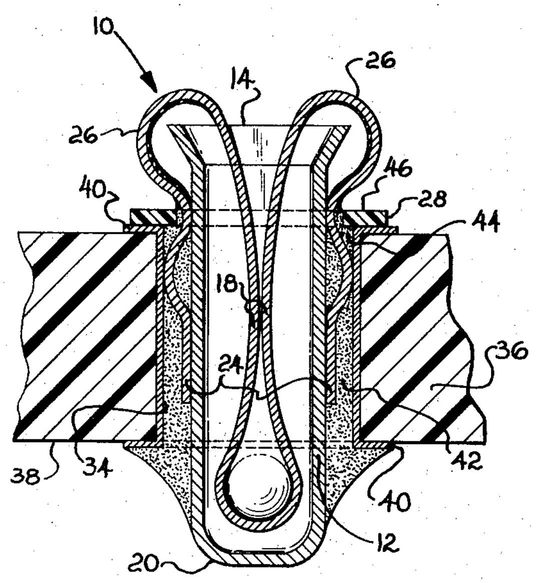
FIG. 3 is a sectional view illustrating the socket soldered to a circuit board.

A flat non-solder adherent collar 28, preferably formed of a plastic material capable of withstanding the temperature of molten solder, is fitted around the end of body 12 adjacent mouth 14 in the recesses 30 between spring curls 26 and the outwardly directed crests 32 of exterior spring arms 24. As illustrated in FIGS. 1 and 2, prior to insertion into the circuit board, the collar is frictionally held on the sides of the recesses 30 away from mouth 14. The interior opening in the collar fits snuggly against the socket. The collar is sufficiently wide so that it extends radially outwardly of the socket body and around the circumference of the body and beyond crests 32.

The end 20 of circuit board socket 10 is inserted in a plated hole 34 extending through the thickness of circuit board 36. During mounting of the socket in the hole, the crests 32 engage the sides of the hole and resiliently hold the socket in plate in the hole. The socket is inserted sufficiently deeply into the hole so that the lower surface of collar 28 engages the upper printed circuit pad 40 and the collar is lifted from crests 32, assuring that the collar rests flush on the pad.

With the socket in position as in FIG. 2, the lower surface of the board is exposed to a wave of molten solder so that the molten solder is brought into contact with the exposed portion of socket 10 and the lower contact pad 44. Molten solder flows up through the path 42 between the socket and the sides of the plated hole 34. The collar effectively prevents the flow of the molten solder onto pad 40 so as to prevent the undesired large solder fillet which might otherwise form between the printed circuit pad and the mouth or lip of opening 14. The formation of such heavy fillets leads to solder flooding in which case the circuit board socket is rendered useless.

The collar fits closely around the socket and rests flush on the pad to close path 42 and prevent molten solder from flowing up beyond pad 40. The flush fit, together with the non-adherent upper collar surface 46 assures that the undesirable large solder fillet, together with the resultant solder flooding are prevented.

While a plastic collar is disclosed, the collar may be made of material having an upper non-solder adherent surface other than plastic. For instance, the collar may comprise a warp of wire coated with a non-solder adherent material or a wrap of non-solder adherent cloth.

Figure 4:
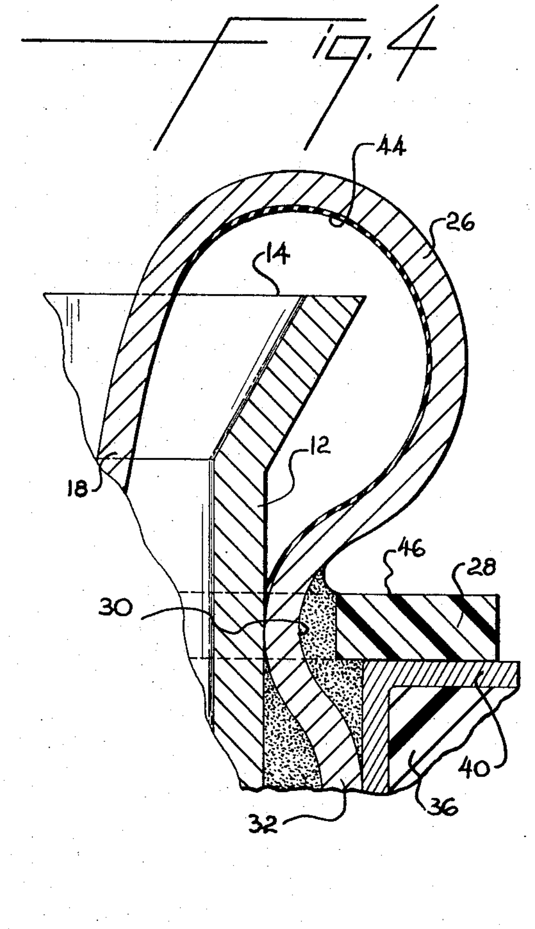
FIG. 4 is an enlargement of a portion of FIG. 3 illustrating the solder connection between the printed circuitry on the board and the upper portion of the circuit board socket.

In some cases, it may be desirable to provide a non-solder adherent coating 46 to the interior surface of curls 26, as illustrated in FIG. 4. Such a coating further assures the elimination of solder flooding and is disclosed in U.S. Pat. No. 3,681,738.

While I have illustrated and described a preferred embodiment of my invention, it is understood that this is capable of modification, and I therefore do not wish to be limited to the precise details set forth, but desire to avail myself of such changes and alterations as fall within the purview of the following claims.

What I claim as my invention is:

1. A circuit board socket of the type adapted to be mounted in a hole extending through a circuit board or like support member and soldered thereto comprising a generally tubular socket having a lead-receiving opening at one end, contact means within the socket to receive a lead extending through such open end, and a non-solder adherent collar surrounding the body adjacent to the open end.

2. A circuit board socket as in claim 1 wherein said collar includes a flat surface facing away from said end and a non-solder adherent surface facing said end.

3. A circuit board socket as in claim 1 wherein the collar extends radially outwardly of the body around the circumference of the body beyond the maximum radial extent of the body on the side of the collar away from the open end.

4. A circuit board socket as in claim 1 wherein said collar comprises a flat member closely fitted around the body, extending radially outwardly of the body and having a non-solder adherent surface facing said end and a flat surface facing away from said end.

5. A circuit board socket as in claim 4 wherein said collar is formed of a plastic material.

6. A contact system comprising a support having a socket-receiving hole formed therein, a socket inserted in the hole in the support including an elongate hollow body having an open end located outwardly of the support, contact means within the body for forming an electrical connection with a lead inserted into the body through the open end, the exterior surface of the body located within the hole being spaced from the hole to form a solder flow path, solder in said path forming an electrical connection between the body and contact means on the support, and a collar closely fitted around the end of the body projecting from the hole and engaging the support so that the collar closes the solder flow path between the body and the hole.

7. A contact system as in claim 6 wherein said collar is formed of a plastic material.

8. A contact system as in claim 6 wherein said collar includes a surface facing away from the open end and lying flush upon the support and a non-solder adherent surface facing toward the open end.

* * * * *

UNITED STATES PATENT OFFICE
CERTIFICATE OF CORRECTION

PATENT NO. : 3,865,455
DATED : February 11, 1975
INVENTOR(S) : Quentin Berg, Deceased It is certified that error appears in the above-identified patent and that said Letters Patent are hereby corrected as shown below:

Column 1, line 27 delete "3,368,738" and substitute therefor --3,681,738--; and line 28, delete "3,681,738".

Signed and sealed this 6th day of May 1975.

(SEAL)
Attest:

RUTH C. MASON
Attesting Officer

C. MARSHALL DANN
Commissioner of Patents and Trademarks